United States Patent
Cho

(10) Patent No.: US 9,082,470 B2
(45) Date of Patent: *Jul. 14, 2015

(54) SEMICONDUCTOR MEMORY APPARATUS AND METHOD OF OPERATING USING THE SAME

(71) Applicant: SK hynix Inc., Icheon-si Gyeonggi-do (KR)

(72) Inventor: Jin Hee Cho, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/339,830

(22) Filed: Jul. 24, 2014

(65) Prior Publication Data

US 2014/0334242 A1    Nov. 13, 2014

Related U.S. Application Data

(63) Continuation of application No. 13/845,224, filed on Mar. 18, 2013, now Pat. No. 8,817,572.

(30) Foreign Application Priority Data

Aug. 29, 2012 (KR) .................. 10-2012-0095163

(51) Int. Cl.
| | | |
|---|---|---|
| G11C 8/00 | (2006.01) | |
| G11C 8/12 | (2006.01) | |
| G11C 8/06 | (2006.01) | |
| G11C 7/22 | (2006.01) | |
| G11C 7/10 | (2006.01) | |
| G11C 7/20 | (2006.01) | |
| G11C 29/12 | (2006.01) | |
| G11C 5/06 | (2006.01) | |

(52) U.S. Cl.
CPC ........ *G11C 8/12* (2013.01); *G11C 5/066* (2013.01); *G11C 7/109* (2013.01); *G11C 7/1051* (2013.01); *G11C 7/1066* (2013.01); *G11C 7/20* (2013.01); *G11C 7/22* (2013.01); *G11C 8/06* (2013.01); *G11C 29/1201* (2013.01)

(58) Field of Classification Search
CPC .. G11C 11/406; G11C 11/40615; G11C 7/00; G11C 7/06; G11C 7/1066; G11C 7/22; G11C 8/00; G11C 8/18
USPC ............ 365/230.06, 230.08, 191, 194, 233.1, 365/233.11, 233.12
See application file for complete search history.

(56) References Cited

U.S. PATENT DOCUMENTS

| | | | | |
|---|---|---|---|---|
| 7,656,745 B2 * | 2/2010 | Kwak | .......................... | 365/233.1 |
| 7,916,570 B2 * | 3/2011 | Ware et al. | ................ | 365/230.03 |
| 8,018,791 B2 * | 9/2011 | Kwak | .......................... | 365/233.1 |
| 8,194,493 B2 * | 6/2012 | Ware et al. | ................ | 365/230.03 |
| 8,270,243 B2 * | 9/2012 | Lee | ................................ | 365/222 |
| 8,817,572 B2 * | 8/2014 | Cho | ......................... | 365/230.08 |

* cited by examiner

*Primary Examiner* — Gene Auduong
(74) *Attorney, Agent, or Firm* — William Park & Associates Ltd.

(57) ABSTRACT

A semiconductor memory apparatus includes a reset pad configured to receive and transfer an external reset signal and an external control signal; a first input buffer configured to buffer the external reset signal in response to a buffer control signal and output an internal reset signal; a second input buffer configured to buffer the external control signal in response to the buffer control signal and output an internal control signal; and an input buffer control unit configured to generate the buffer control signal in response to an external command.

4 Claims, 4 Drawing Sheets

SEMICONDUCTOR MEMORY APPARATUS AND METHOD OF OPERATING USING THE SAME

CROSS-REFERENCES TO RELATED APPLICATION

The present application claims priority under 35 U.S.C. §119(a) to Korean application number 10-2012-0095163, filed on Aug. 29, 2012, in the Korean Intellectual Property Office, which is incorporated herein by reference in its entirety.

BACKGROUND

1. Technical Field

Various embodiments relate to a semiconductor integrated circuit, and more particularly, to a semiconductor memory apparatus.

2. Related Art

In general, a semiconductor memory apparatus receives a command, an address, data, etc. from an outside, stores the inputted data, and outputs the stored data.

In order to receive a command, an address, data, etc. from an outside, a semiconductor memory apparatus includes a pad for coupling the inside of the semiconductor memory apparatus with the outside.

While the number of pads included in a semiconductor memory apparatus should be increased in order for the semiconductor memory apparatus to store an increased amount of data and perform an increased number of operations, the number of pads which can be included in one semiconductor memory apparatus is limited.

A semiconductor memory apparatus is configured to perform an initializing operation by receiving a reset signal from an outside.

Referring to FIG. 1, a semiconductor memory apparatus includes a reset pad 10, an input buffer 20, and a reset control unit 30.

The reset pad 10 receives an external reset signal RESET_ext from an outside of the semiconductor memory apparatus.

The input buffer 20 receives and buffers the external reset signal RESET_ext of a CML (current mode logic) level and generates an internal reset signal RESET_int of a CMOS (complementary metal oxide semiconductor) level.

The reset control unit 30 is configured to initialize internal circuits (not shown) in response to the internal reset signal RESET_int.

The reset operation of the semiconductor memory apparatus provides advantages in that the initialization and recovered state of the semiconductor memory apparatus are ensured and thus the stability of a system is improved. However, since the reset operation is performed only in limited cases such as the initial power-up stage of the semiconductor memory apparatus and when the initialization of the semiconductor memory apparatus is necessary, the reset pad 10 remains as an unused pad during a normal operation.

Therefore, in order for the semiconductor memory apparatus to store an increased amount of data or perform an increased number of operations, it is necessary to develop a semiconductor memory apparatus capable of efficiently using pads of a limited number.

SUMMARY

A semiconductor memory apparatus which can use a reset pad even in an operation other than a reset operation of the semiconductor memory apparatus is described herein.

In an embodiment of the present invention, a semiconductor memory apparatus includes: a reset pad configured to receive and transfer an external reset signal and an external control signal; a first input buffer configured to buffer the external reset signal and output an internal reset signal; a second input buffer configured to buffer the external control signal and output an internal control signal; and an input buffer control unit configured to activate or deactivate the first and second input buffers in response to an external command.

In an embodiment of the present invention, a semiconductor memory apparatus includes: a reset pad configured to receive and transfer an external reset signal and an external control signal; a first input buffer configured to buffer the external reset signal in response to a buffer control signal and output an internal reset signal; a second input buffer configured to buffer the external control signal in response to the buffer control signal and output an internal control signal; and an input buffer control unit configured to generate the buffer control signal in response to an external command.

In an embodiment of the present invention, a semiconductor memory apparatus includes: a reset pad configured to receive and transfer an external reset signal and an external additional address; a first input buffer configured to buffer the external reset signal in response to a buffer control signal and output an internal reset signal; a second input buffer configured to buffer the external additional address in response to the buffer control signal and output an internal additional address; a third input buffer configured to buffer an external address transferred through an address pad and output an internal address; a first address latch unit configured to latch the internal additional address and output an additional latched address; a second address latch unit configured to latch the internal address and output a latched address; and an input buffer control unit configured to generate the buffer control signal in response to an external command.

In an embodiment of the present invention, a semiconductor memory apparatus includes: a reset pad configured to receive and transfer an external reset signal and an external control signal; an input buffer configured to buffer the inputted external reset signal when the external reset signal is inputted and output a first internal reset signal, and buffer the inputted external control signal when the external control signal is inputted and output a first internal control signal; an output selection unit configured to output the first internal reset signal as a second internal reset signal or output the first internal control signal as a second internal control signal, in response to a select signal; a reset control unit configured to reset internal circuits in response to the second internal reset signal; an internal circuit control unit configured to control the internal circuits in response to the second internal control signal; and a mode register set configured to generate the select signal in response to an external command.

In an embodiment of the present invention, a method of operating a semiconductor memory apparatus, includes: receiving and transferring an external reset signal and an external control signal through a reset pad; buffering the external reset signal and outputting an internal reset signal with a first input buffer in response to a buffer control signal; buffering the external control signal and outputting an internal control signal with a second input buffer in response to the buffer control signal; and generating the buffer control signal in response to an external command with an input buffer control unit.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through various embodiments.

Figure 1:
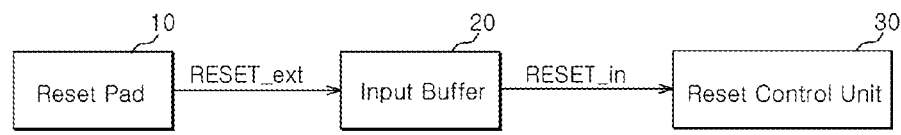
FIG. 1 is a configuration diagram of a conventional semiconductor memory apparatus.
Figure 2:
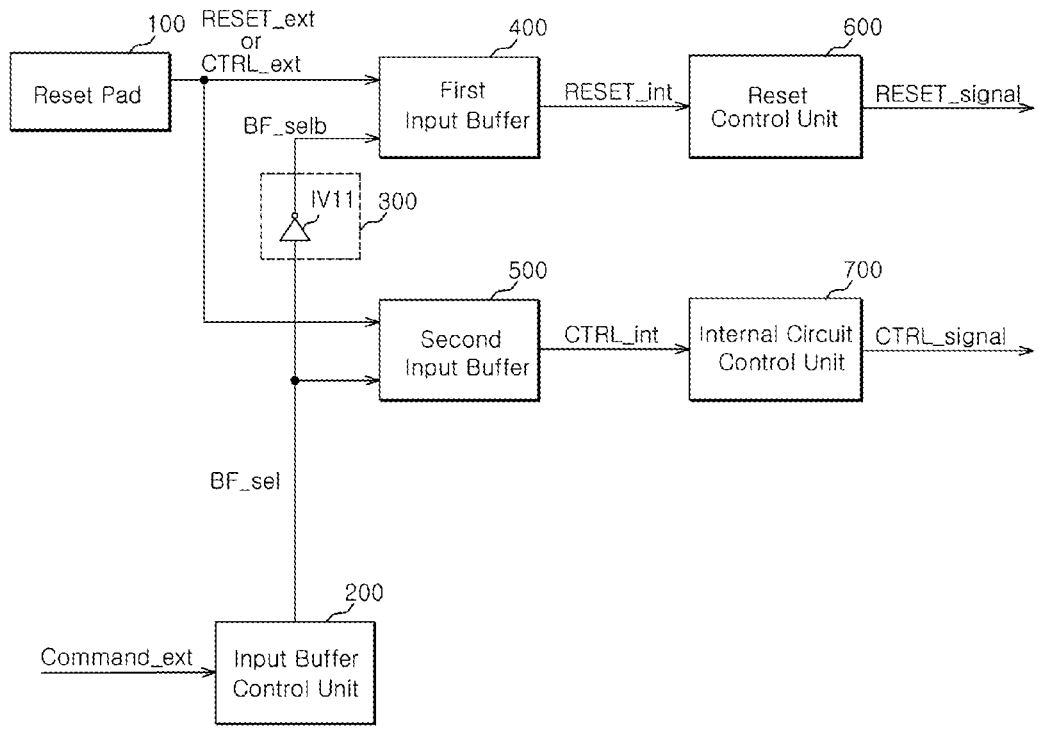
FIG. 2 is a configuration diagram of a semiconductor memory apparatus in accordance with an embodiment of the present invention.

Referring to FIG. 2, a semiconductor memory apparatus in accordance with an embodiment of the present invention may include a reset pad 100, an input buffer control unit 200, a signal inversion unit 300, first and second input buffers 400 and 500, a reset control unit 600, and an internal circuit control unit 700.

The reset pad 100 may be configured to receive and transfer an external reset signal RESET_ext and/or an external control signal CTRL_ext.

The input buffer control unit 200 may be configured to generate a buffer control signal BF_sel in response to an external command Command_ext. For example, the input buffer control unit 200 may include a mode register set which enables or disables the buffer control signal BF_sel in response to the external command Command_ext.

The signal inversion unit 300 may be configured to invert the buffer control signal BF_sel and output a resultant signal. The signal inversion unit 300 may include an inverter IV11. The inverter IV11 inverts the buffer control signal BF_sel and outputs an inverted buffer control signal BF_selb.

The first input buffer 400 may be configured to buffer the external reset signal RESET_ext according to the buffer control signal BF_sel and output an internal reset signal RESET_int. For example, the first input buffer 400 may be activated when the buffer control signal BF_sel is enabled. The activated first input buffer 400 buffers the external reset signal RESET_ext and outputs the internal reset signal RESET_int. Additionally, the first input buffer 400 may be deactivated when the buffer control signal BF_sel is disabled.

The second input buffer 500 may be configured to buffer the external control signal CTRL_ext according to the buffer control signal BF_sel and may output an internal control signal CTRL_int. For example, the second input buffer 500 is activated when the buffer control signal BF_sel is disabled, that is, when the inverted buffer control signal BF_selb is enabled. The activated second input buffer 500 buffers the external control signal CTRL_ext and outputs the internal control signal CTRL_int. Additionally, the second input buffer 500 is deactivated when the buffer control signal BF_sel is enabled, that is, when the inverted buffer control signal BF_selb is disabled.

The reset control unit 600 may be configured to generate a reset signal RESET_signal which controls the reset operations of internal circuits (not shown), in response to the internal reset signal RESET_int.

The internal circuit control unit 700 may be configured to generate a control signal CTRL_signal which controls the internal circuits, in response to the internal control signal CTRL_int.

The semiconductor memory apparatus in accordance with the embodiments of the present invention, configured as mentioned above, may operate as follows.

The input buffer control unit 200 enables or disables the buffer control signal BF_sel in response to the external command Command_ext.

The first input buffer 400 is activated when the buffer control signal BF_sel is enabled, and the second input buffer 500 is deactivated when the buffer control signal BF_sel is enabled. At this time, the reset pad 100 receives the external reset signal RESET_ext and transfers the external reset signal RESET_ext to the activated first input buffer 400.

The first input buffer 400 is deactivated when the buffer control signal BF_sel is disabled, and the second input buffer 500 is activated when the buffer control signal BF_sel is disabled. At this time, the reset pad 100 receives the external control signal CTRL_ext and transfers the external control signal CTRL_ext to the activated second input buffer 500.

The input buffer control unit 200 enables or disables the buffer control signal BF_sel according to the external command Command_ext. In response to the buffer control signal BF_sel generated in this way, the first input buffer 400 is activated and the second input buffer 500 is deactivated, or the first input buffer 400 is deactivated and the second input buffer 500 is activated.

According to the external command Command_ext, the first input buffer 400 for buffering the external reset signal RESET_ext is activated or the second input buffer 500 for buffering the external control signal CTRL_ext is activated.

Accordingly, the semiconductor memory apparatus in accordance with the embodiments of the present invention may receive two kinds of signals (the external reset signal RESET_ext and the external control signal CTRL_ext) which are inputted with different timing, through one reset pad 100, and may use the signals for different uses (the reset operations of the internal circuits and the control operations of the internal circuits).

In other words, the reset operation of the semiconductor memory apparatus is performed in the case where a power supply voltage is first applied to the semiconductor memory apparatus and in the case where it is determined by a controller for controlling the semiconductor memory apparatus that the reset operation of the semiconductor memory apparatus is necessary. Except in these two cases, an operation in which the external reset signal RESET_ext is inputted through the reset pad 100 is not performed. Therefore, when the reset operation is not performed in the semiconductor memory apparatus, the external control signal CTRL_ext for controlling the internal circuits may be inputted through the reset pad 100. In particular, the semiconductor memory apparatus in accordance with the embodiments of the present invention may be configured in such a manner that the reset pad 100 may be used to receive an external control signal necessary for control operations for other internal circuits, except the case where the controller performs the reset operation for the semiconductor memory apparatus.

Figure 3:
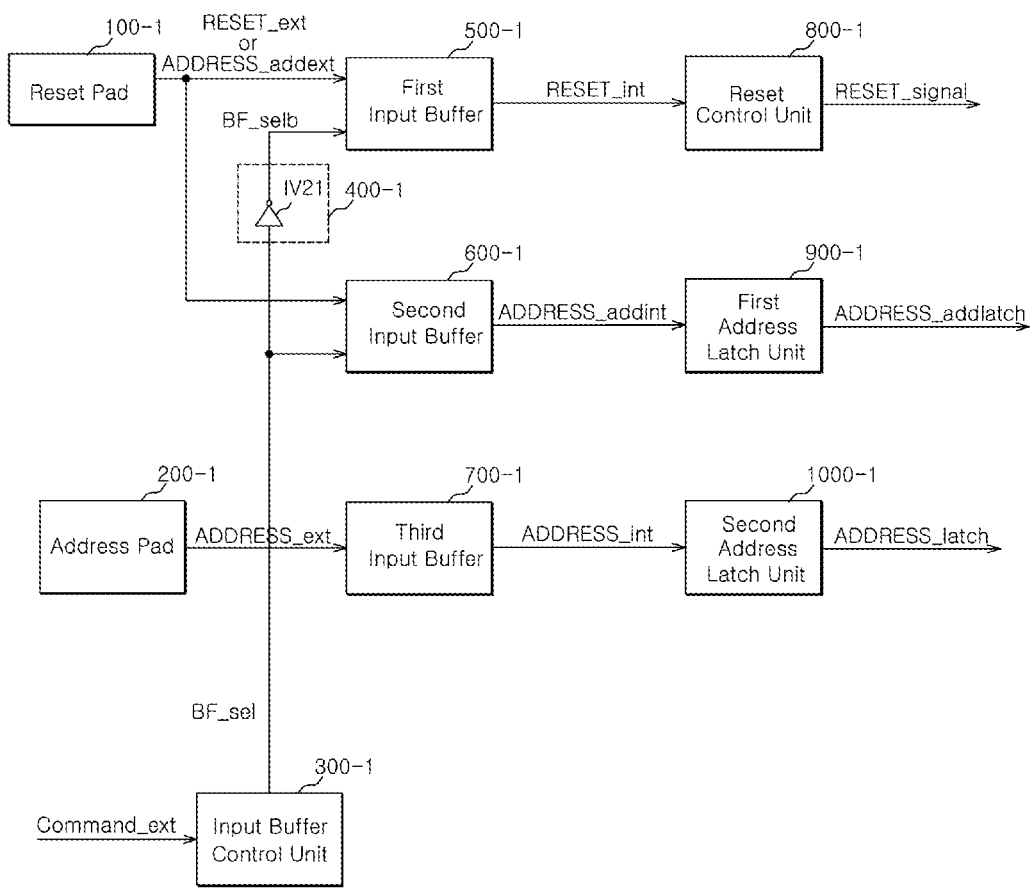
FIG. 3 is a configuration diagram of a semiconductor memory apparatus in accordance with an embodiment of the present invention.

Referring to FIG. 3, a semiconductor memory apparatus in accordance with an embodiment of the present invention may include a reset pad 100-1, an address pad 200-1, an input buffer control unit 300-1, a signal inversion unit 400-1, first to third input buffers 500-1, 600-1 and 700-1, a reset control unit 800-1, and first and second address latch units 900-1 and 1000-1.

The reset pad 100-1 may be configured to receive and transfer an external reset signal RESET_ext and/or an external additional address ADDRESS_addext.

The address pad 200-1 may be configured to receive and transfer an external address ADDRESS_ext.

The input buffer control unit 300-1 may be configured to generate a buffer control signal BF_sel in response to an external command Command_ext. For example, the input buffer control unit 300-1 may include a mode register set which enables or disables the buffer control signal BF_sel in response to the external command Command_ext.

The signal inversion unit 400-1 may be configured to invert the buffer control signal BF_sel and output an inverted buffer control signal BF_selb. The signal inversion unit 400-1 may include an inverter IV21. The inverter IV21 inverts the buffer control signal BF_sel and outputs the inverted buffer control signal BF_selb.

The first input buffer 500-1 may be configured to buffer the external reset signal RESET_ext according to the buffer control signal BF_sel and output an internal reset signal RESET_int. For example, the first input buffer 500-1 is activated when the buffer control signal BF_sel is enabled, that is, when the inverted buffer control signal BF_selb is disabled. The activated first input buffer 500-1 buffers the external reset signal RESET_ext and outputs the internal reset signal RESET_int.

The second input buffer 600-1 may be configured to buffer the external additional address ADDRESS_addext according to the buffer control signal BF_sel and output an internal additional address ADDRESS_addint. For example, the second input buffer 600-1 is activated when the buffer control signal BF_sel is disabled. The activated second input buffer 600-1 buffers the external additional address ADDRESS_addext and outputs the internal additional address ADDRESS_addint. At this time, the responding speed of the second input buffer 600-1 is faster than the first input buffer 500-1. This is because the effective signal width of the external reset signal RESET_ext is longer than the external address ADDRESS_ext. Thus, the responding speeds of the second and third input buffers 600-1 and 700-1 which buffer the external additional address ADDRESS_addext and the external address ADDRESS_ext should be faster than the first input buffer 500-1 which buffers the external reset signal RESET_ext.

The third input buffer 700-1 may be configured to buffer the external address ADDRESS_ext and output an internal address ADDRESS_int.

The reset control unit 800-1 may be configured to generate a reset signal RESET_signal which controls the reset operations of internal circuits (not shown), in response to the internal reset signal RESET_int.

The first address latch unit 900-1 may be configured to latch the internal additional address ADDRESS_addint and output an additional latched address ADDRESS_addlatch.

The second address latch unit 1000-1 may be configured to latch the internal address ADDRESS_int and output a latched address ADDRESS_latch.

Operations of the semiconductor memory apparatus in accordance with an embodiment of the present invention, configured as mentioned above, will be described below.

A power supply voltage is first applied to the semiconductor memory apparatus. The semiconductor memory apparatus initializes itself by performing a power-up operation and a reset operation.

The input buffer control unit 300-1 enables the buffer control signal BF_sel in response to the external command Command_ext which is outputted from a controller (not shown).

When the buffer control signal BF_sel is enabled, the first input buffer 500-1 buffers the external reset signal RESET_ext which is transferred from the reset pad 100-1, and outputs the internal reset signal RESET_int. At this time, the second input buffer 600-1 is deactivated.

If the internal reset signal RESET_int is enabled, the reset control unit 800-1 generates the reset signal RESET_signal for initializing the internal circuits.

When the power-up operation and reset operation of the semiconductor memory apparatus are completed, the input buffer control unit 300-1 disables the buffer control signal BF_sel in response to the external command Command_ext which is outputted from the controller.

If the buffer control signal BF_sel is disabled, the first input buffer 500-1 does not generate the internal reset signal RESET_int any more. Additionally, if the buffer control signal BF_sel is disabled, the second input buffer 600-1 is activated.

The activated second input buffer 600-1 buffers the external additional address ADDRESS_addext which is inputted from the reset pad 100-1, and outputs the internal additional address ADDRESS_addint.

Further, the third input buffer 700-1 buffers the external address ADDRESS_ext which is inputted from the address pad 200-1, and outputs the internal address ADDRESS_int.

The first address latch unit 900-1 latches the internal additional address ADDRESS_addint which is inputted from the second input buffer 600-1, and outputs the additional latched address ADDRESS_addlatch.

The second address latch unit 1000-1 latches the internal address ADDRESS_int which is inputted from the third input buffer 700-1, and outputs the latched address ADDRESS_latch.

In this way, the semiconductor memory apparatus in accordance with an embodiment of the present invention may receive an additional address using the reset pad 100-1 during a period in which the reset pad 100-1 is not used. For example, while a semiconductor memory apparatus which receives 30 addresses from 5 address pads should receive the addresses through 6 times, the semiconductor memory apparatus in accordance with an embodiment of the present invention may use a total of 6 address pads and may receive the addresses through a total of 5 times. Accordingly, the semiconductor memory apparatus in accordance with an embodiment of the present invention may be advantageously used in a semiconductor memory apparatus which trends toward high speed operation and large capacity.

If it is determined that the reset operation is necessary during the normal operation of the semiconductor memory apparatus, the controller inputs the external command Command_ext to the input buffer control unit 300-1. The input buffer control unit 300-1 enables again the buffer control signal BF_sel in response to the external command Command_ext. If the buffer control signal BF_sel is enabled, the second input buffer 600-1 is deactivated and the first input buffer 500-1 is activated.

The activated first input buffer 500-1 buffers again the external reset signal RESET_ext and outputs again the internal reset signal RESET_int. As the internal reset signal RESET_int is inputted to the reset control unit 800-1, the internal circuits are initialized.

In this way, the semiconductor memory apparatus in accordance with an embodiment of the present invention may use the reset pad as a pad for receiving an additional address while the reset operation is not performed using the reset pad.

Figure 4:
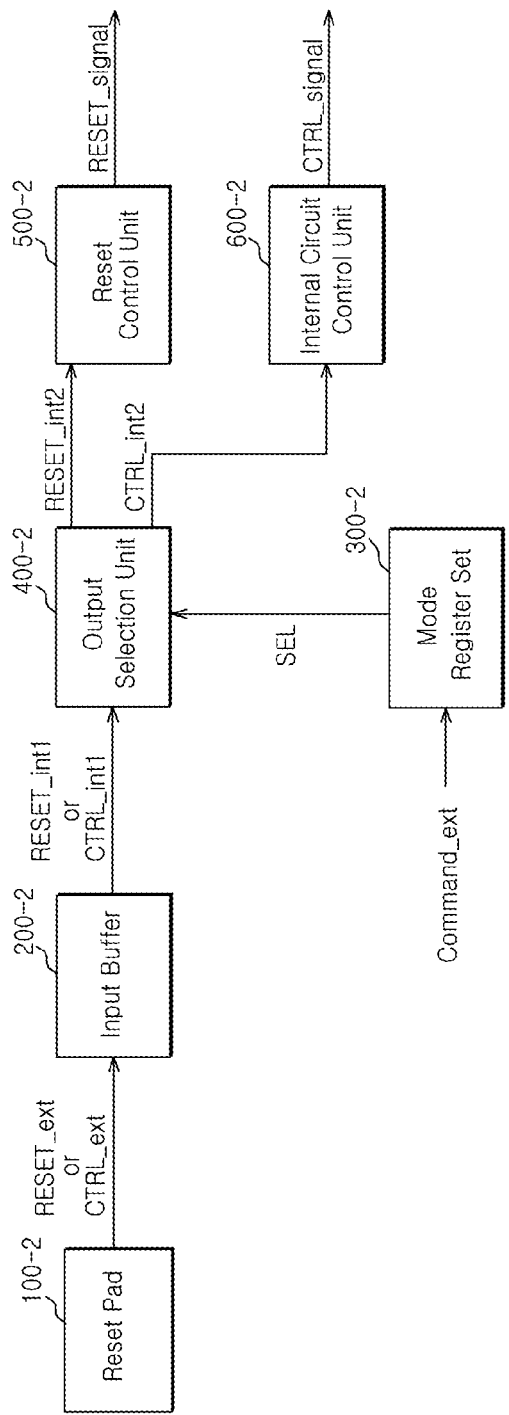
FIG. 4 is a configuration diagram of a semiconductor memory apparatus in accordance with an embodiment of the present invention.

Referring to FIG. 4, a semiconductor memory apparatus in accordance with an embodiment of the present invention may include a reset pad 100-2, an input buffer 200-2, a mode register set 300-2, an output selection unit 400-2, a reset control unit 500-2, and an internal circuit control unit 600-2.

The reset pad 100-2 may be configured to receive and transfer an external reset signal RESET_ext and/or an external control signal CTRL_ext.

The input buffer 200-2 may be configured to buffer the inputted external reset signal RESET_ext when the external reset signal RESET_ext is inputted from the reset pad 100-2, and output a first internal reset signal RESET_int1. Further, the input buffer 200-2 may be configured to buffer the inputted external control signal CTRL_ext when the external control signal CTRL_ext is inputted from the reset pad 100-2, and output a first internal control signal CTRL_int1.

The mode register set 300-2 may be configured to generate a select signal SEL in response to an external command Command_ext. For example, the mode register set 300-2 enables or disables the select signal SEL in response to the external command Command_ext.

The output selection unit 400-2 may be configured to output the first internal reset signal RESET_int1 as a second internal reset signal RESET_int2 or output the first internal control signal CTRL_int1 as a second internal control signal CTRL_int2, in response to the select signal SEL. For example, when the select signal SEL is enabled, the output selection unit 400-2 outputs the first internal reset signal RESET_int1 as the second internal reset signal RESET_int2 and disables the second internal control signal CTRL_int2. Also, when the select signal SEL is disabled, the output selection unit 400-2 outputs the first internal control signal CTRL_int1 as the second internal control signal CTRL_int2 and disables the second internal reset signal RESET_int2.

The reset control unit 500-2 may be configured to generate a reset signal RESET_signal for initializing internal circuits (not shown), in response to the second internal reset signal RESET_int2.

The internal circuit control unit 600-2 may be configured to generate a control signal CTRL_signal for controlling the internal circuits, in response to the second internal control signal CTRL_int2.

Figure 5:
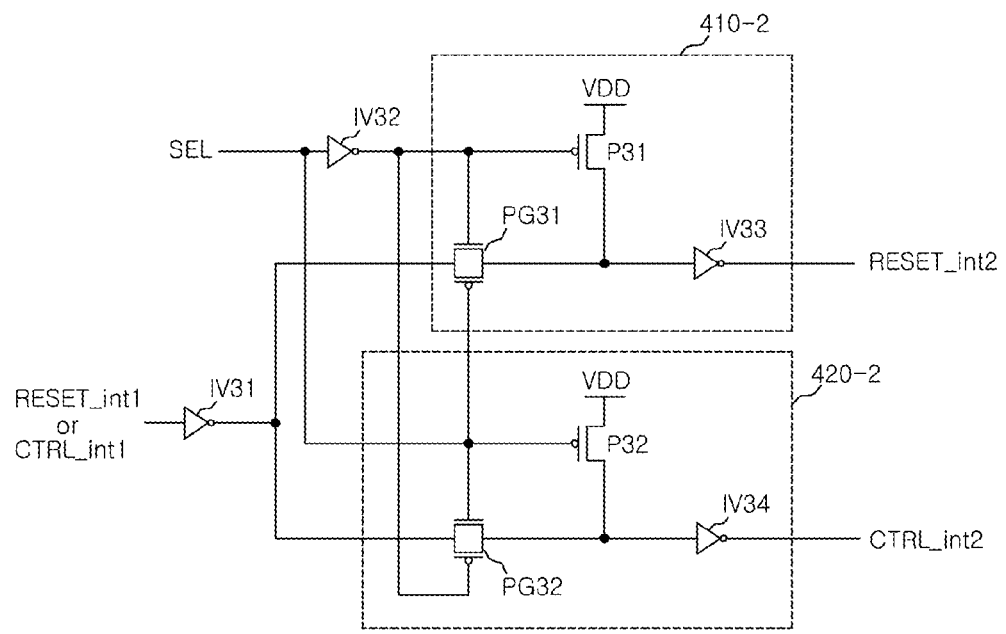
FIG. 5 is a configuration diagram of the output selection unit of FIG. 4.

Referring to FIG. 5, the output selection unit 400-2 may include first and second output selecting sections 410-2 and 420-2, and first and second inverters IV31 and IV32.

The first inverter IV31 receives the first internal reset signal RESET_int1 or the first internal control signal CTRL_int1.

The second inverter IV32 receives the select signal SEL.

The first output selecting section 410-2 may be configured to output the first internal reset signal RESET_int1 as the second internal reset signal RESET_int2 when the select signal SEL is enabled. Moreover, the first output selecting section 410-2 may be configured to disable the second internal reset signal RESET_int2 when the select signal SEL is disabled.

The second output selecting section 420-2 may be configured to output the first internal control signal CTRL_int1 as the second internal control signal CTRL_int2 when the select signal SEL is disabled. Moreover, the second output selecting section 420-2 may be configured to disable the second internal control signal CTRL_int2 when the select signal SEL is enabled.

The first output selecting section 410-2 may include a first pass gate PG31, a first transistor P31 and a third inverter IV33. The first pass gate PG31 receives the output signal of the first inverter IV31, and has a first control terminal which receives the output signal of the second inverter IV32 and a second control terminal which receives the select signal SEL. The first transistor P31 has a gate which receives the output signal of the second inverter IV32, a source to which an external voltage VDD is applied, and a drain to which the output terminal of the first pass gate PG31 is coupled. The third inverter IV33 has an input terminal to which the output terminal of the first pass gate PG31 is coupled, and an output terminal from which the second internal reset signal RESET_int2 is outputted.

The second output selecting section 420-2 may include a second pass gate PG32, a second transistor P32 and a fourth inverter IV34. The second pass gate PG32 receives the output signal of the first inverter IV31, and has a first control terminal which receives the select signal SEL and a second control terminal which receives the output signal of the second inverter IV32. The second transistor P32 has a gate which receives the select signal SEL, a source to which the external voltage VDD is applied, and a drain to which the output terminal of the second pass gate PG32 is coupled. The fourth inverter IV34 has an input terminal to which the output terminal of the second pass gate PG32 is coupled, and an output terminal from which the second internal control signal CTRL_int2 is outputted.

The semiconductor memory apparatus in accordance with an embodiment of the present invention, configured as mentioned above, may operate as follows.

As a power supply voltage, that is, an external voltage is applied to the semiconductor memory apparatus, the semiconductor memory apparatus initializes itself by performing a power-up operation and a reset operation.

The mode register set 300-2 enables the select signal SEL in response to the external command Command_ext which is outputted from a controller (not shown).

If the select signal SEL is enabled, the output selection unit 400-2 outputs the first internal reset signal RESET_int1 which is generated as the external reset signal RESET_ext inputted through the reset pad 100-2 is buffered through the input buffer 200-2, as the second internal reset signal RESET_int2. Also, the output selection unit 400-2 disables the second internal control signal CTRL_int2.

The reset control unit 500-2 generates the reset signal RESET_signal for initializing the internal circuits, in response to the second internal reset signal RESET_int2.

If the power-up operation and reset operation of the semiconductor memory apparatus are completed, the controller outputs the external command Command_ext for disabling the select signal SEL. The mode register set 300-2 which has received the external command Command_ext disables the select signal SEL.

The output selection unit 400-2, which has received the disabled select signal SEL, outputs the first internal control signal CTRL_int1 which is generated as the external control signal CTRL_ext inputted through the reset pad 100-2 is buffered through the input buffer 200-2, as the second internal control signal CTRL_int2. Also, the output selection unit 400-2 disables the second internal reset signal RESET_int2.

The internal circuit control unit 600-2 generates the control signal CTRL_signal for controlling the internal circuits, in response to the second internal control signal CTRL_int2.

Additionally, after the power-up operation and reset operation which were performed as the external voltage is initially applied to the semiconductor memory apparatus, if the reset operation becomes necessary in the semiconductor memory apparatus, the controller may output the external command Command_ext for enabling the select signal SEL. If such external command Command_ext is inputted to the mode register set 300-2, the external reset signal RESET_ext outputted from the controller is buffered and becomes the first internal reset signal RESET_int1, and, as the first internal reset signal RESET_int1 is inputted to the reset control unit 500-2 as the second internal reset signal RESET_int2, the semiconductor memory apparatus performs again the initializing operation.

Accordingly, the semiconductor memory apparatus in accordance with an embodiment of the present invention may receive two kinds of signals (the external reset signal RESET_ext and the external control signal CTRL_ext) which are inputted with different timing, through one reset pad 100-2, and may use the signals for different uses (the reset operations of the internal circuits and the control operations of the internal circuits).

In other words, the reset operation of the semiconductor memory apparatus is performed in the case where a power supply voltage is first applied to the semiconductor memory apparatus and in the case where it is determined by a controller for controlling the semiconductor memory apparatus that the reset operation of the semiconductor memory apparatus is necessary. Except these two cases, an operation in which the external reset signal RESET_ext is inputted through the reset pad 100-2 is not performed. Therefore, when the reset operation is not performed in the semiconductor memory apparatus, the external control signal CTRL_ext for controlling the internal circuits may be inputted through the reset pad 100-2. In particular, the semiconductor memory apparatus in accordance with an embodiment of the present invention may be configured in such a manner that the reset pad 100-2 may be used to receive an external control signal necessary for a control operation for other internal circuits, except the case where the controller performs the reset operation for the semiconductor memory apparatus.

Moreover, because the reset pad may be used as a pad for inputting a test signal in a test, a test time and test costs may be decreased.

While various embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
    a reset pad configured to receive and transfer an external reset signal and an external control signal;
    an input buffer configured to buffer an output signal of the reset pad; and
    an output selection unit configured to output the output signal of the reset pad as an internal reset signal or output the output signal of the reset pad as an internal control signal in response to a select signal according to an external command.

2. The semiconductor memory apparatus according to claim 1, further comprising:
    a mode register set configured to generate the select signal in response to the external command.

3. The semiconductor memory apparatus according to claim 2,
    wherein the output selection unit is configured to output the output signal of the reset pad as the internal reset signal when the select signal is enabled, and output the output signal of the reset pad as the internal control signal when the select signal is disabled.

4. The semiconductor memory apparatus according to the claim 3,
    wherein the output selection unit is configured to disable the internal control signal when the selection signal is enabled, and disable the internal reset signal when the selection signal is disabled.

* * * * *